United States Patent
Veches et al.

(10) Patent No.: US 9,305,625 B2
(45) Date of Patent: Apr. 5, 2016

(54) APPARATUSES AND METHODS FOR UNIT IDENTIFICATION IN A MASTER/SLAVE MEMORY STACK

(71) Applicant: Micron Technology, Inc., Boise, ID (US)

(72) Inventors: Anthony D. Veches, Boise, ID (US); Joshua E. Alzheimer, Boise, ID (US); Dennis R. Blankenship, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/455,456

(22) Filed: Aug. 8, 2014

(65) Prior Publication Data

US 2014/0347948 A1 Nov. 27, 2014

Related U.S. Application Data

(63) Continuation of application No. 13/709,792, filed on Dec. 10, 2012, now Pat. No. 8,817,547.

(51) Int. Cl.
*G11C 7/00* (2006.01)
*G11C 8/12* (2006.01)
*G11C 5/14* (2006.01)
*G11C 5/02* (2006.01)
*G11C 7/10* (2006.01)

(52) U.S. Cl.
CPC .. *G11C 8/12* (2013.01); *G11C 5/02* (2013.01); *G11C 5/14* (2013.01); *G11C 7/00* (2013.01); *G11C 7/10* (2013.01)

(58) Field of Classification Search
CPC .................................. G11C 7/00; G11C 5/14
USPC ............................................. 365/189.011, 226
See application file for complete search history.

(56) References Cited

U.S. PATENT DOCUMENTS

| 6,740,981 B2 * | 5/2004 | Hosomi | G11C 8/12 257/686 |
|---|---|---|---|
| 7,823,116 B2 | 10/2010 | Chan | |
| 7,834,391 B2 | 11/2010 | Kang et al. | |
| 8,780,600 B2 * | 7/2014 | Fai | G11C 5/063 257/E21.705 |
| 2005/0082664 A1 | 4/2005 | Funaba et al. | |
| 2006/0233012 A1 * | 10/2006 | Sekiguchi et al. | 365/51 |
| 2011/0050320 A1 | 3/2011 | Gillingham | |
| 2011/0110064 A1 | 5/2011 | Foster, Sr. et al. | |
| 2012/0007624 A1 * | 1/2012 | Byeon | G11C 7/10 324/750.15 |
| 2012/0008360 A1 * | 1/2012 | Kang | 365/49.1 |
| 2012/0032318 A1 * | 2/2012 | Sasaki et al. | 257/686 |
| 2012/0059984 A1 * | 3/2012 | Kang et al. | 711/106 |
| 2012/0081984 A1 | 4/2012 | Yun et al. | |
| 2012/0124408 A1 * | 5/2012 | Byeon et al. | 713/501 |

(Continued)

*Primary Examiner* — Michael Tran
(74) *Attorney, Agent, or Firm* — Dorsey & Whitney LLP

(57) ABSTRACT

Apparatuses and methods including a plurality of memory units are disclosed. An example apparatus includes a plurality of memory units. Each of the plurality of memory units include a master/slave identification (ID) node coupled to a first voltage source node via a resistive element. Each of the plurality of memory units further include a master/slave ID circuit configured to determine whether a memory unit is a master memory unit or a slave memory unit based on a voltage level detected at the master/slave ID node. The master/slave ID node of each of the plurality of memory units other than a first memory unit is further coupled to a respective second voltage source node via a through—substrate via (TSV) of a respective adjacent memory unit of the plurality of memory units.

20 Claims, 6 Drawing Sheets

(56) References Cited

U.S. PATENT DOCUMENTS

| | | |
|---|---|---|
| 2012/0124532 A1 | 5/2012 | Coteus et al. |
| 2012/0131258 A1* | 5/2012 | Park .................................. 711/5 |
| 2012/0154008 A1* | 6/2012 | Kim et al. ..................... 327/202 |
| 2012/0249229 A1* | 10/2012 | Ko et al. ........................ 327/564 |
| 2012/0256321 A1* | 10/2012 | Sasaki et al. .................. 257/777 |
| 2013/0111122 A1* | 5/2013 | Song et al. .................... 711/105 |
| 2013/0151829 A1* | 6/2013 | Amann et al. .................... 713/2 |
| 2014/0160867 A1 | 6/2014 | Veches et al. |
| 2014/0208156 A1* | 7/2014 | Muralimanohar et al. .. 714/6.24 |

\* cited by examiner

APPARATUSES AND METHODS FOR UNIT IDENTIFICATION IN A MASTER/SLAVE MEMORY STACK

CROSS REFERENCE TO RELATED APPLICATION(S)

This application is a continuation of pending U.S. patent application Ser. No. 13/709,792, filed Dec. 10, 2012, which application is incorporated herein by reference in its entirety, for any purpose.

TECHNICAL FIELD

Embodiments of the invention relate generally to electronic memories, and more particularly, in one or more of the illustrated embodiments, to master/slave identification and chip select signal propagation in a memory stack.

DESCRIPTION OF RELATED ART

Advances in technology have resulted in high density memory architecture. The high density memory architecture has led to memory packages that include several memory dies stacked together. In order to make the memory packaging transparent to a external controllers, communication with individual memory dies of a memory package is facilitated through a memory die identified as a master memory die. Access to the memory of the master memory die and the slave memory dies is made through the use of chip select signals corresponding to the memory dies of the stack. Master/slave die identification and determining response to memory commands, addresses, and/or data based on chip select signals has resulted in greater levels of complexity, requiring additional die area attributed to master/slave identification and chip select signal detection functions.

DETAILED DESCRIPTION

Certain details are set forth below to provide a sufficient understanding of embodiments of the invention. However, it will be clear to one having ordinary skill in the art that embodiments of the invention may be practiced without these particular details. Moreover, the particular embodiments of the present invention described herein are provided by way of example and should not be used to limit the scope of the invention to these particular embodiments.

Figure 1:
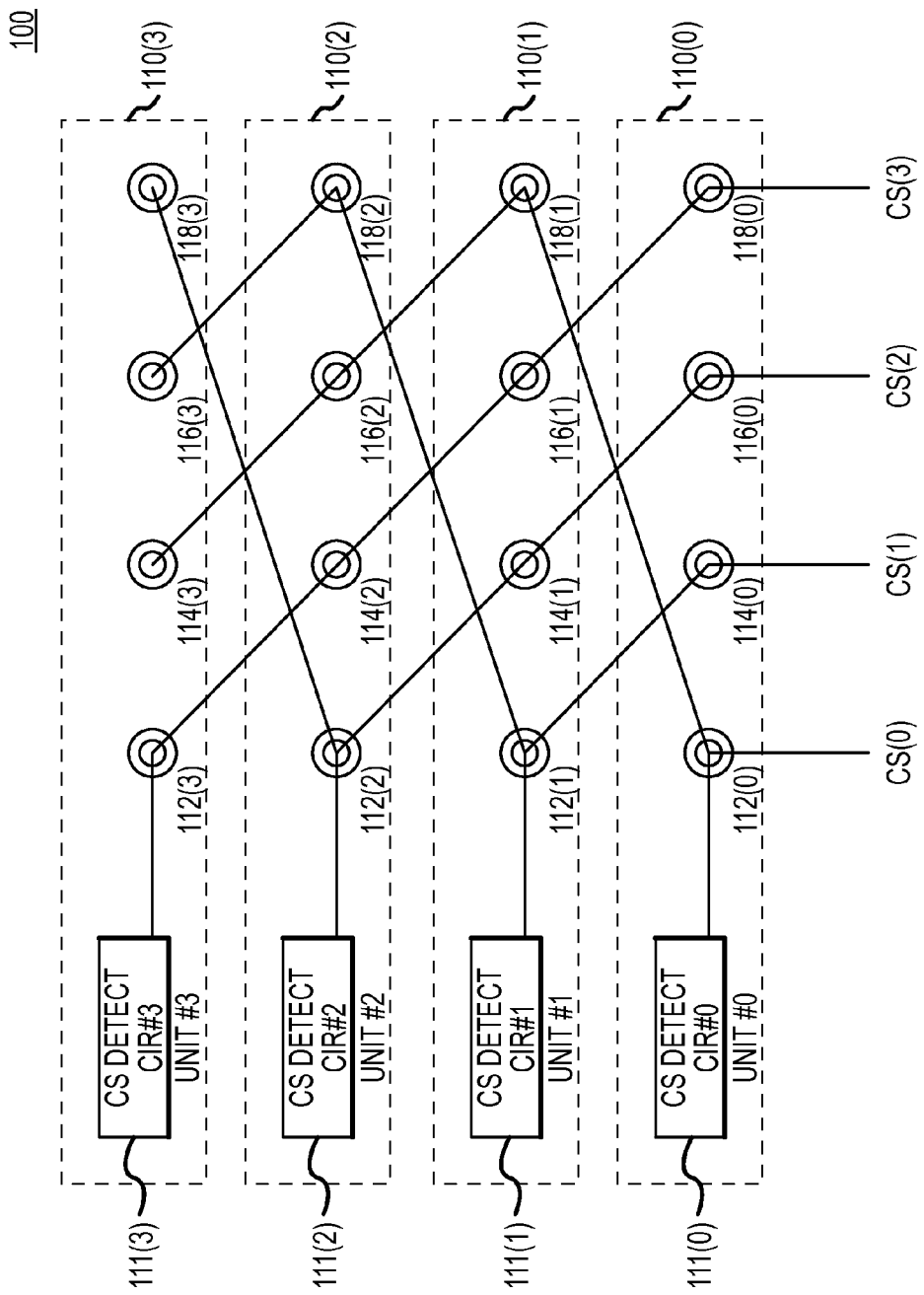
FIG. 1 is a block diagram of a particular illustrative embodiment of chip select detection circuits in a memory package.

Referring to FIG. 1, a particular illustrative embodiment of an apparatus including chip select detection circuits in a memory package is disclosed and generally designated apparatus 100. The apparatus 100 may be used for detecting active states on corresponding chip select signals at each memory unit 110(0-3) of the apparatus 100. The apparatus 100 may include a plurality of memory units, such as a memory unit 110(0), a memory unit 110(1), a memory unit 110(2), and a memory unit 110(3). The memory units 110 may be memory formed on separate semiconductor die. Each of the memory units 110(0-3) includes a chip select detection circuit (e.g., a chip select detection circuit 111(0), a chip select detection circuit 111(1), a chip select detection circuit 111(2), and a chip select detection circuit 111(3)) each coupled to a respective first chip select node (e.g., a first chip select node 112(0), a first chip select node 112(1), a first chip select node 112(2), and a first chip select node 112(3)). Each of the memory units 110 further includes second, third, and fourth chip select nodes 114, 116, 118 in addition to the first chip select node 112. In some embodiments, the memory units 100(0-3) of the apparatus 100 may be identical. The chip select node 114, 116, 118, other than the first chip select node 112(0-3) may be coupled to a chip select node of an adjacent memory unit to propagate a chip select signal to an adjacent memory unit.

In an embodiment, the memory unit 110(0) may be a master memory unit. Identification of a master/slave memory unit is described further with reference to FIGS. 3 and 4. The memory unit 110(0) may be configured to receive chip select (CS) signals from an external controller (not shown), such as a CS(0) signal at the first chip select node 112(0), a CS(1) signal at a second chip select node 114(0), a CS(2) signal at a third chip select node 116(0), and a CS(3) signal at a fourth chip select node 118(0). Each of the second chip select node 114(0), the third chip select node 116(0), and the fourth chip select node 118(0) may be coupled to a chip select node of the memory unit 110(1). For example, the second chip select node 114(0), the third chip select node 116(0), and the fourth chip select node 118(0) are coupled to the first chip select node 112(1), a second chip select node 114(1), and a third chip select node 116(1), respectively, of the memory unit 110(1).

The memory unit 110(1), the memory unit 110(2), and the memory unit 110(3) may each be slave memory units. The memory units 110(0-3) may each be configured to receive, via the memory unit 110(0), a corresponding CS signal (e.g., the CS(1) signal, the CS(2) signal, and the CS(3) signal, respectively) at the respective chip select detection circuit 111(1-3). The corresponding CS(1-3) signal is propagated through each memory unit 110(0-3) to a first chip select node 112(1-3) of the respective memory unit 110(1-3). For example, the memory unit 110(1) may receive the CS(1) signal at the first chip select node 112(1), the memory unit 110(2) may receive the CS(2) signal at the first chip select node 112(2), and the memory unit 110(3) may receive the CS(3) signal at the first chip select node 112(3).

The chip select detection circuits 111(0-3) may be configured to detect an active state of a corresponding CS(0-3) signal. Each chip select detection circuit provides an indication to the respective memory unit as to whether memory commands, addresses, and/or data being received are applicable to the respective memory unit.

During operation, the CS(0) signal may be received at the first chip select node 112(0) of the memory unit 110(0). The chip select detection circuit 111(0) may provide a chip selection enable to the memory unit 110(0) based on the CS(0) signal. Similarly, the CS signal (1) may be received at the first chip select node 112(1) of the memory unit 110(1) via the second chip select node 114(0) of the memory unit 110(0). The chip select detection circuit 111(1) may provide a chip selection enable to the memory unit 110(1) based on the CS(1) signal. The CS(2) signal may be received at the first chip select node 112(2) of the memory unit 110(2) via the second chip select node 114(1) of the memory unit 110(1) via the third chip select node 116(0) of the memory unit 110(0). The chip select detection circuit 111(2) may provide a chip selection enable to the memory unit 110(2) based on the CS(2) signal. The CS(3) signal may be received at the first chip select node 112(3) of the memory unit 110(3) via the second chip select node 114(2) of the memory unit 110(2) via the third chip select node 116(1) of the memory unit 110(1) via the fourth chip select node 118(0) of the memory unit 110(0). The chip select detection circuit 111(4) may provide a chip selection enable to the memory unit 110(3) based on the CS(3) signal.

As previously discussed, in some embodiments the memory units 100(0-3) of the apparatus 100 may be identical. Accordingly, each memory unit 110(0-3) may have the same memory architecture, including memory addressing. Additionally, each of the memory units 110(0-3) may share common command, address, and data buses (not shown). Thus, in order for an external memory controller (not shown) to target a specific memory unit in the apparatus 100, an active CS signal corresponding to the specific memory unit is used. The corresponding active CS signal may cause the specific memory unit to process the incoming memory commands, addresses, and/or data provided on the common command, address, and data buses. The other memory units are provided inactive CS signals that may cause the specific memory unit to ignore the incoming command, addresses, and data. Each of the memory units 110(0-3) may receive the corresponding CS signal at the first chip select node 112(0-3), and may disregard the other CS signals received at the other nodes 114, 116, 118.

It will be appreciated by those having ordinary skill in the art that the apparatus 100 can be modified to accommodate more or less than four memory units. For example, memory groups according to embodiments of the present invention may be stacked in configurations 8-high, 16-high, 32-high, and so on. It will also be appreciated by those having ordinary skill in the art that a master memory unit may receive at least a number of CS signals to accommodate the number of memory units, and each memory unit may have at least a number of chip select nodes required to facilitate propagation of CS signals to subsequent memory unit in the package.

The chip select nodes 112, 114, 116, 118 of the memory units 110(0-3) may be coupled through a laddered chip select architecture. In a laddered chip select architecture, the chip select nodes of each memory unit are physically located in the same relative position, but the coupling of the chip select nodes of a memory unit to the chip select nodes of another memory unit are offset. A laddered chip select architecture simplifies the chip select detection circuits 111(0-3) as compared with an architecture in which a chip select node is coupled with a respective aligned chip select node of adjacent memory units. The CS signal received on nodes other than the first chip select node 112(0-3) may be ignored.

Figure 2:
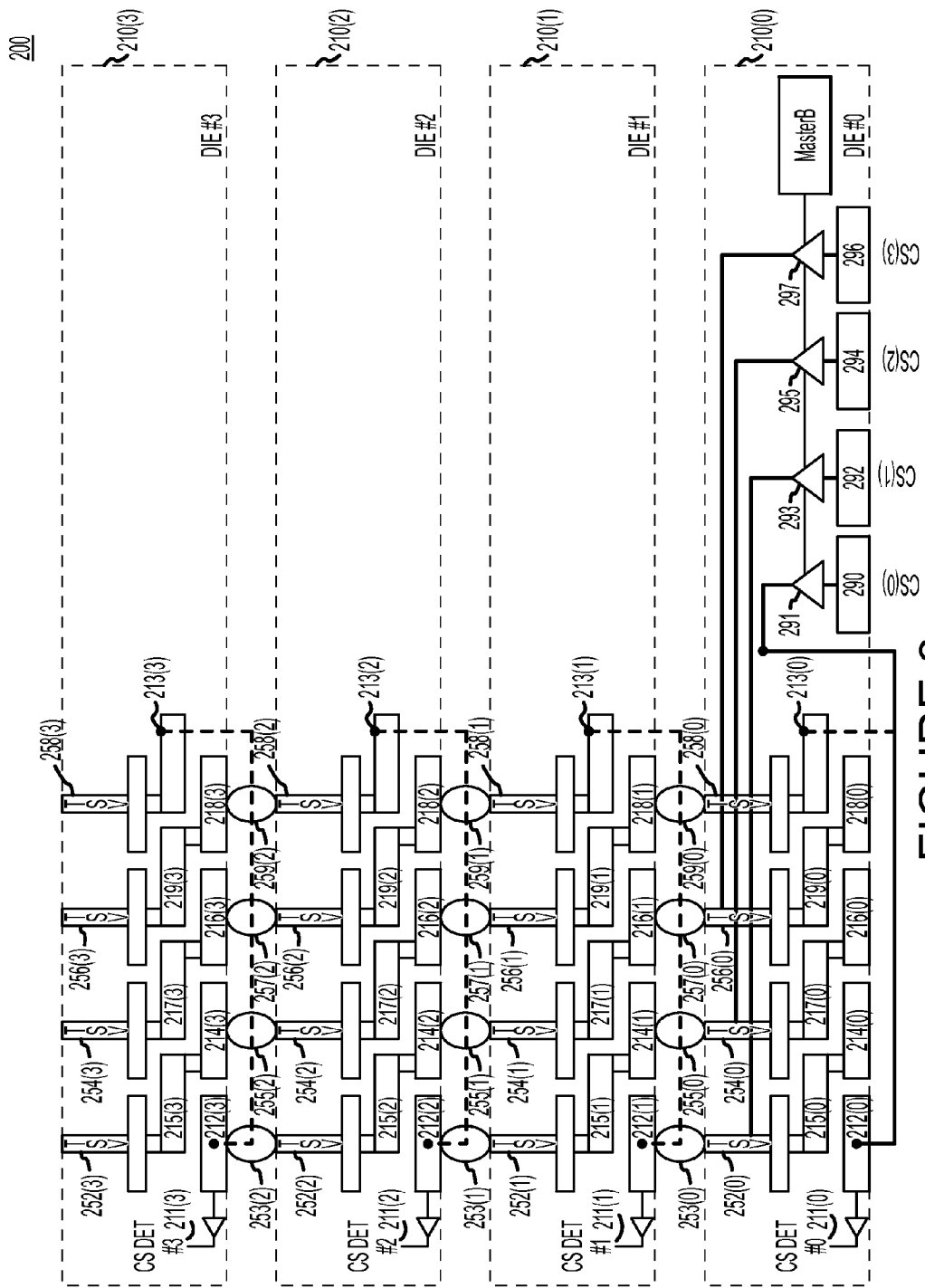
FIG. 2 is a block diagram of a particular illustrative embodiment of chip select detection circuits in a memory package.

Referring to FIG. 2, a particular illustrative embodiment of an apparatus including chip select circuits in a memory package is disclosed and generally designated apparatus 200. The apparatus 200 may provide an architecture for detecting active states of corresponding chip select signals at each memory unit of the memory stack. The apparatus 200 may include a plurality of memory units, such as a memory unit 210(0), a memory unit 210(1), a memory unit 210(2), and a memory unit 210(3). The memory units 210 may be memory formed on separate semiconductor die. Each of the memory units 210(0-3) includes chip select detection circuit (e.g., a chip select detection circuit 211(0), a chip select detection circuit 211(1), a chip select detection circuit 211(2), and a chip select detection circuit 211(3)) coupled to a respective first chip select node (e.g., a first chip select node 212(0), a first chip select node 212(1), a first chip select node 212(2), and a first chip select node 212(3)). The apparatus 200 may be used to implement the apparatus 100 of FIG. 1. Each chip select node, other than the first chip select node 212(0-3) (e.g., the second chip select node 214(0-3), the third chip select node 216 (0-3), and the fourth chip select node 218(0-3)), may be coupled to a chip select node of an adjacent memory unit to propagate a respective CS signal to an adjacent memory unit.

Each of the memory units 210 (0-3) may include at least four chip select vias. In an embodiment, each of the memory units 210 (0-3) may include at least four chip select through-substrate vias (TSVs) (e.g., first chip select TSV 252(0-3), second chip select TSV 254(0-3), third chip select TSV 256 (0-3), and fourth chip select TSV 258(0-3)) coupled to respective chip select interconnectors (e.g., 213(0-3), 215(0-3), 217(0-3), and 219(0-3)). Each of the memory units may include four chip select nodes (e.g., first chip select node 212(0-3), second chip select node 214(0-3), third chip select node 216(0-3), and fourth chip select node 218(0-3)). Each of the four chip select nodes 212(0-3), 214(0-3), 216(0-3), 218 (0-3) is aligned with a respective chip select TSV 252(0-3), 254(0-3), 256(0-3), 258(0-3). For example, the first chip select node 212(0-3) is aligned with the first chip select TSV (252(0-3), the second chip select node 214(0-3) is aligned with the first chip select TSV (254(0-3), the third chip select node 216(0-3) is aligned with the third chip select TSV (256 (0-3), and the fourth chip select node 218(0-3) is aligned with the fourth chip select TSV (258(0-3). Three of the four chip select nodes of a memory unit may be coupled to a respective TSV (via a respective chip select interconnector) that is offset from the corresponding chip select node. For example, in the memory unit 110(0), the second chip select node 214(0) is coupled to the first chip select TSV 252(0), the third chip select node 216(0) is coupled to the second chip select TSV 254(0), and the fourth chip select node 218(0) is coupled to the third chip select TSV 256(0). The TSVs and the chip select nodes of the other memory units (e.g., memory unit 110(1-3)) may be coupled in a similar manner. In an embodiment, for each memory unit, the first chip select node 212(0-3) may be coupled to the fourth chip select TSV 258(0-3), which are nonadjacent to the first chip select node 212(0-3). In an embodiment, each of the chip select TSVs 252, 254, 256, and 258 include a first conductive material. Further, each of the chip select nodes 212, 214, 216, 218 may include a second conductive material. Each of the chip select interconnectors 213, 215, 217, 219 may include a third conductive material. In an embodiment, the first conductive material is the same as the second conductive material and the third conductive material.

The memory unit 210(0) may be a master memory unit. Each of memory unit 210(1-3) may be slave memory units. The memory unit 210(0), being the master, may provide an interface to an external controller (not shown). For example, the memory unit 210(0) may be configured to receive, from the external controller, chip select(CS) signals, such as a CS(0) signal at a first chip select input node 290, a CS(1) signal at a second chip select input node 292, a CS(2) signal at a third chip select input node 294, and a CS(3) signal at a fourth chip select input node 296. Each of the first chip select input nodes 290, the second chip select input node 292, the third chip select input node 294, and the fourth chip select input node 296 may be coupled a first chip select input buffer 291, a second chip select input buffer 293, a third chip select input buffer 295, and a fourth chip select input buffer 297, respectively, to drive the respective CS(0-3) signal to each memory unit 110(0-3). The CS(0-3) signals identify the particular memory unit 110(0-3) to which received memory commands, addresses, and/or data (not shown) are being directed.

The memory units 110(0-3) are coupled together with respective conductive interconnectors (e.g., solder balls) between a TSV and a chip select node. For example, the first chip select TSV 252(0-2) may be coupled to an adjacent first chip select node 212(1-3) via a respective first chip select interconnector 253(0-2). Similarly, a second chip select interconnector 255(0-2) couples a second chip select TSV 254(0-2) to an adjacent second chip select node 214(1-3), a third chip select interconnector 257(0-2) couples a third chip select TSV 256(0-2) to an adjacent third chip select node 216(1-3), and a fourth chip select interconnector 259(0-2

During operation, each of the CS(0-3) signals may be received at the respective chip select input nodes 290, 292, 294, 296 of the memory unit 210(0). Each of the CS(0-3) signals may be propagated through the memory units 210(0-3) to an offset chip select node of an adjacent memory unit. For example, the CS(2) signal is propagated from the second chip select node 214(1) through the first chip select TSV 252(1) to the first chip select node 212(2). The laddered chip select architecture allows a CS(0-3) signal to be received at a same respective first chip select node 112(0-3) on each memory unit (e.g., the CS(0) signal is received on the first chip select node 212(0) of the memory unit 210(0), the CS(1) signal is received on the first chip select node 212(1) of the memory unit 210(1), the CS(2) signal is received on the first chip select node 212(2) of the memory unit 210(2), the CS(3) signal is received on the first chip select node 212(3) of the memory unit 210(3)). The chip select detection circuit 211(0-3) is coupled to the corresponding first chip select node 212(0-3) of each corresponding memory unit 210(0-3). Each of the memory units 210(0-3) may be responsive to the respective CS(0-3) signal received at the first chip select node 212(0-3), and may ignore the other chip select signals.

As explained above, CS signals are used by a memory unit to select a memory unit to be responsive to memory commands, addresses, or data provided on the shared buses. The memory units 210(0-3) of the apparatus 200 may be designed to be interchangeable with each other. Accordingly, each of the memory units 210(0-3) in a stack may have a similar architecture for offsetting the coupling of CS signals as the CS signals propagate through the apparatus 200. Thus, the CS(0-3) signal corresponding to the particular memory unit 210(0-3) may be coupled to a same first chip select node 212(0-3). Therefore, the chip select detection circuit 211(0-3) for each memory unit 210(0-3) may be coupled to the first chip select node 212(0-3), and may ignore chip select signals received at the second chip select node 114(0-3), the third chip select node 116(0-3), and the fourth chip select node 118(0-3). The laddered chip select architecture affords a simple design without requiring any special coupling between the respective slave memory units 110(0-3) to determine a respective position within the apparatus 200.

The apparatus 200 is depicted with four memory units, e.g., one master memory unit and three slave memory units. It will be appreciated by those having ordinary skill in the art that the apparatus 200 can be scaled to accommodate more or less than four memory units, e.g., a plurality of interconnected memory units. Accordingly, it will also be appreciated by those having ordinary skill in the art that a master memory unit 210(0) may be designed with a number of chip select input nodes that is equal to a total number of memory units, and each of the memory unit 210(0-3) may have at least a number of chip select nodes and input buffers required to facilitate propagation of CS signals to subsequent memory unit in the package. It will also be appreciated by those having ordinary skill in the art that, while unused, each slave memory unit 210(1-3) may be include chip select input nodes (e.g., 290, 292, 294, and 296) and input buffers (e.g., 291, 293, 295, and 297) similar to the master memory unit 210(0). The chip select input nodes and input buffers are not shown in FIG. 2 in order to simplify the illustration and description of the laddered chip select architecture. Fuses or another identification methods may be used to disable excess chip select input buffers on a master memory unit and all chip select input buffers on slave memory units. For example, fuses may be blown to identify a number of memory units in the apparatus 200.

Figure 3:
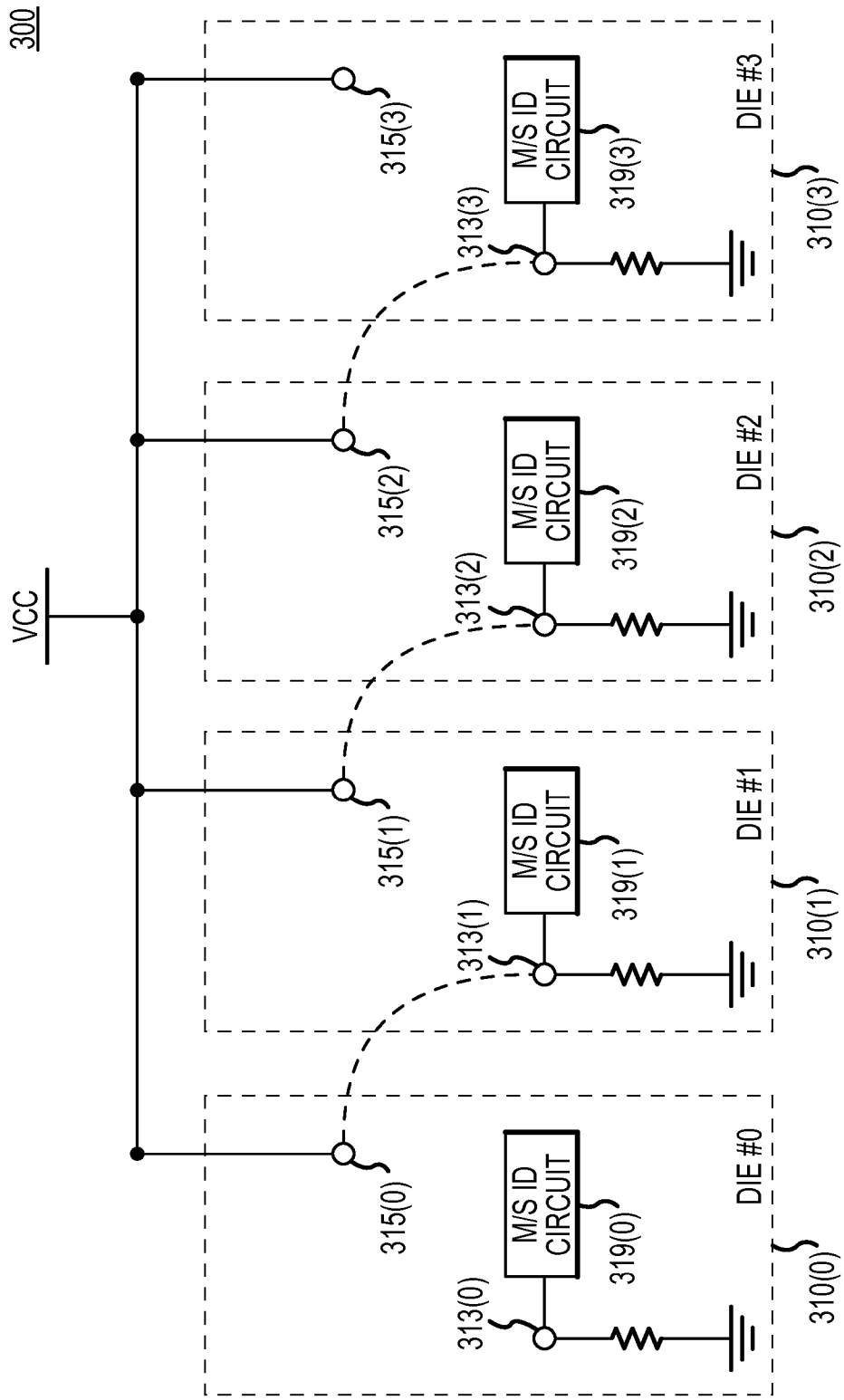
FIG. 3 is a block diagram of a particular illustrative embodiment of master/slave identification circuits in a memory package.

Referring to FIG. 3, a particular illustrative embodiment of an apparatus including master/slave identification circuits in a memory package is disclosed and generally designated apparatus 300. The apparatus 300 may be used for master/slave identification at each memory unit 310(0-3) of the apparatus 300. The apparatus 300 may include a plurality of memory units, such as a first memory unit 310(0), a second memory unit 310(1), a third memory unit 310(2), and a fourth memory unit 310(3). The memory units 310 may be memory formed on separate semiconductor die. Each of the memory units 310(0-3) includes a master/slave identification circuit (e.g., a master/slave identification circuit 319(0), a master/slave identification circuit 319(1), a master/slave identification circuit 319(2), and a master/slave identification circuit 319(4)) coupled to a respective master/slave identification node (e.g., a master/slave identification node 313(0), a master/slave identification node 313(1), a master/slave identification node 313(2), and a master/slave identification node 313(3)). In some embodiments, the memory units 310(0-3) of the apparatus 300 may be substantially identical. For example, each of the memory units 310(0-3) may be fabricated using a common die and fabrication process.

Each of the memory units 310(0-3) may include the respective master/slave identification node 313(0-3) coupled to the respective master/slave identification circuit 319(0-3). The respective master/slave identification node 313(0-3) may be coupled to a first voltage source node 310(0-3), such as a reference voltage source, via a resistive element. The reference voltage source may be, for example, ground. Each of the memory unit 310(0-3) may also include a second voltage source node 315(0-3) coupled to a second voltage source, such as a VCC voltage source. The second voltage source node 315(0-3) may be coupled to the master/slave identification node of the adjacent memory unit. For example, the second voltage source node 315(0) of the memory unit 310(0) may be coupled to the master/slave identification node 313(1) of the memory unit 310(1), the second voltage source node 315(1) of the memory unit 310(1) may be coupled to the master/slave identification node 313(2) of the memory unit 310(2), and the second voltage source node 315(2) of the memory unit 310(2) may be coupled to the master/slave identification node 313(3) of the memory unit 310(3).

During operation, the respective master/slave identification circuit 319(0-3) of each of the memory unit 310(0-3) identifies whether the respective memory unit is a master memory unit or a slave memory unit based on a voltage level of the respective master/slave identification node 313(0-3).

For example, the master/slave identification node 313(0) of the memory unit 310(0) is coupled to the first voltage source. Thus, a voltage level of the master/slave identification node 313(0) may be pulled to approximately a first voltage level of the first voltage source. Accordingly, the master/slave identification circuit 319(0) may identify the memory unit 310(0) as a master memory unit based on the voltage level of the master/slave identification node 313(0) being approximately the first voltage level. Further, the master/slave identification node 313(1) of the memory unit 310(1) may be coupled to the second voltage source via the second voltage source node 315(0) of the memory unit 310(0). Thus, a voltage level of the master/slave identification node 313(1) is pulled to approximately a second voltage level of the second voltage source. As a result, the master/slave identification circuit 319(1) may identify the memory unit 310(1) as a slave memory unit based on a voltage level of the master/slave identification node 313(1) being approximately equal to the second voltage level. The master/slave identification node 313(2) of the memory unit 310(2) and the master/slave identification node 313(3) of the memory unit 310(3) may be coupled to the second voltage source in a similar manner as the master/slave identification node 313(1) of the memory unit 310(1), and, therefore, may be identified as slave memory units by the respective master/slave identification circuit 319(2-3).

The master/slave identification architecture of the apparatus 300 may be used for identifying a master memory unit within the apparatus 300. The master memory unit may provide a single interface with external memory controllers. Using a master memory unit within the apparatus 300 as a single interface with external memory controllers, data buses, etc. simplifies communication buses and lines necessary to communicate with external controllers. As a single interface for the apparatus 300, the master memory unit (e.g., the memory unit 310(0)) performs additional functions to provide appropriate commands, addresses, signals, and/or data to each of the slave units in the memory stack. Since each of the memory units in the apparatus 300 may be identical, each memory unit identified as a slave may disable the additional memory functionality performed by the master memory unit. The apparatus 300 may be implemented without providing a specific position of a particular memory unit to the particular memory unit. The apparatus 300 may also not require that a number of memory units in a memory package be known by the memory units for master/slave identification purposes.

Figure 4:
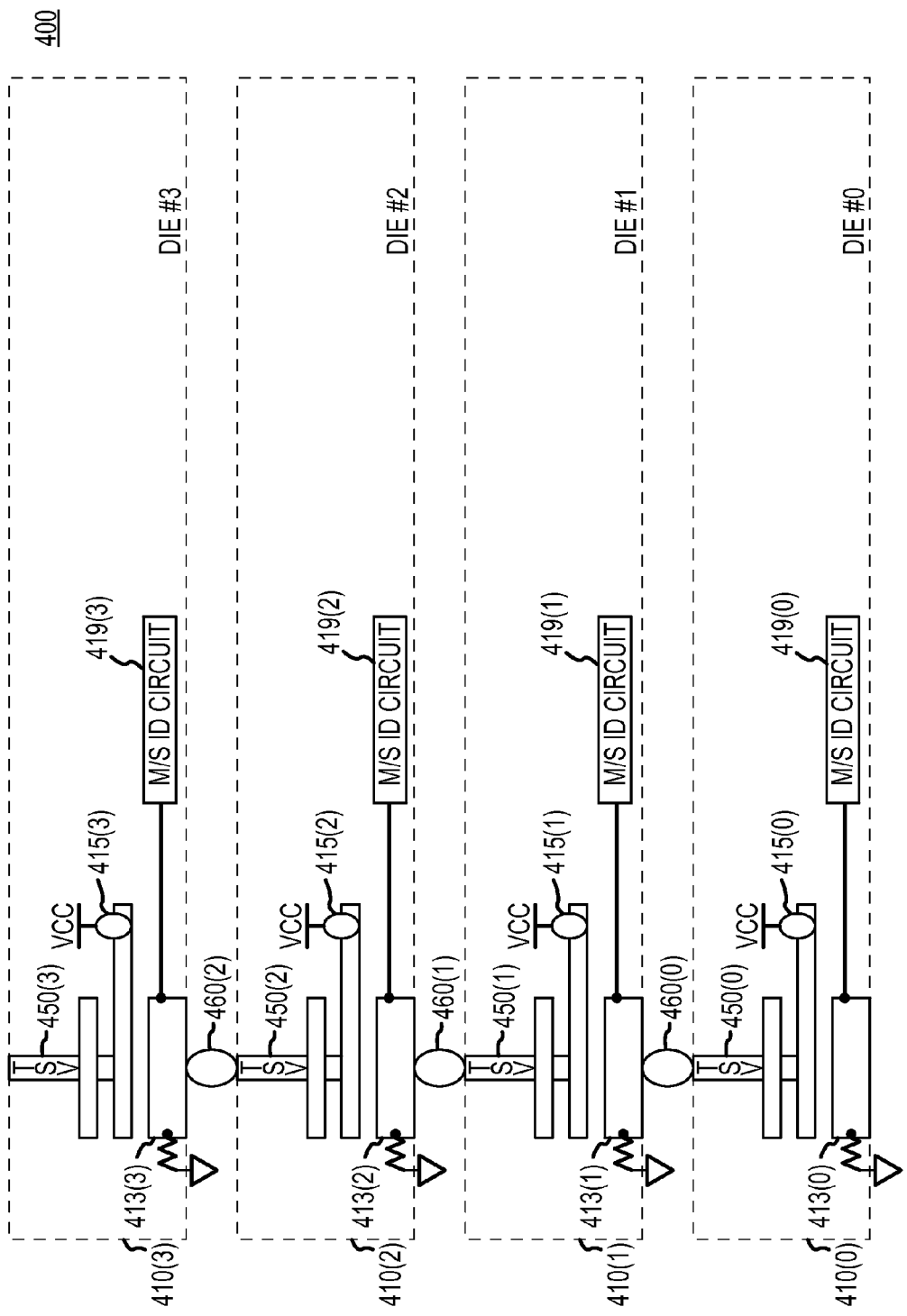
FIG. 4 is a block diagram of a particular illustrative embodiment of master/slave identification circuits in a memory package.

Referring to FIG. 4, a particular illustrative embodiment of an apparatus including master/slave identification circuits in a memory package is disclosed and generally designated apparatus 400. The apparatus 400 may be used for master/slave identification at each memory unit 410(0-3) of the apparatus 400. The apparatus 400 may include a plurality of memory units, such as a memory unit 410(0), a memory unit 410(1), a memory unit 410(2), and a memory unit 410(3). Each of the memory unit 410(0-3) includes master/slave identification circuit (e.g. a master/slave identification circuit 419(0), a master/slave identification circuit 419(1), a master/slave identification circuit 419(2), and a master/slave identification circuit 419(3)) coupled to a respective master/slave identification node (e.g., a master/slave identification node 413(0), a master/slave identification node 413(1), a master/slave identification node 413(2), and a master/slave identification node 413(3)). In some embodiments, the memory units 410(0-3) of the apparatus 400 may be identical. The memory unit 410(0-3) may correspond to the memory unit 310(0-3) of FIG. 3.

The master/slave identification node 413(0-3) of each of the memory units 410(0-3) may be coupled to a first voltage source, such as reference voltage source, via a resistive element. The reference voltage source may be, for example, ground. Each of the memory units 410 (0-3) may include a via coupled to a second voltage source, such as a VCC voltage source, via a second voltage source node 415(0-3). The via may be a through-substrate via (TSV) 450(0-3), such as a through-silicon via. The TSV 450(0-2) may contact a master/slave identification node 413(1-3) in an adjacent memory unit via a conductive inter-connector 460(0-2). For example, in the memory unit 410(1), the master/slave identification node 413(1) is coupled to the TSV 450(0) of the memory unit 410(0) via the conductive inter-connector 460(0). The TSVs 450(1-2) and the master/slave identification nodes master/slave identification node 413(2-3) of the other memory units (e.g., memory unit 410(1-3) may be coupled in a similar manner. In an embodiment, each of the TSVs 450(0-3) include a first conductive material. Further, each of the master/slave identification nodes 413(0-3) may include a second conductive material. Each of the second voltage source nodes 415(0-3) may include a third conductive material. In an embodiment, the first conductive material is the same as the second conductive material and the third conductive material.

As explained with reference to FIG. 3, the respective master/slave identification circuit 419(0-3) of each of the memory unit 410(0-3) identifies whether the memory unit 410(0-3) is a master memory unit or a slave memory unit based on a voltage level of the respective master/slave identification node 413(0-3). For example, based on the master/slave identification node 413(0) of the memory unit 410(0) being pulled to approximately a voltage level of the first voltage source, the master/slave identification circuit 419(0) identifies the memory unit 410(0) as a master memory unit. Further, based on the master/slave identification node 413(1) of the memory unit 410(1) being pulled to approximately a second voltage level of the second voltage source, the master/slave identification circuit 419(1) identifies the memory unit 410(1) as a slave memory unit. The master/slave identification node 413(2) of the memory unit 410(2) and the master/slave identification node 413(3) of the memory unit 410(3) may be may be identified as slave memory units by the respective master/slave identification circuits master/slave identification circuit 419(2-3) based on the master/slave identification node 413(2-3) being pulled to the second voltage level of the second voltage source.

The apparatus 400 is depicted with four memory units, e.g., one master memory unit and three slave memory units. It will be appreciated by those having ordinary skill in the art that the 400 can be scaled to accommodate more or less than four memory units. Further, it would also be appreciated by those having ordinary skill in the art that the apparatus 300 of FIG. 3 and the apparatus 400 of FIG. 4 may be combined with the apparatus 100 of FIG. 1 and/or the apparatus 200 of FIG. 2 into a memory unit to provide a combined master/slave identification system and a chip select system.

Figure 5:
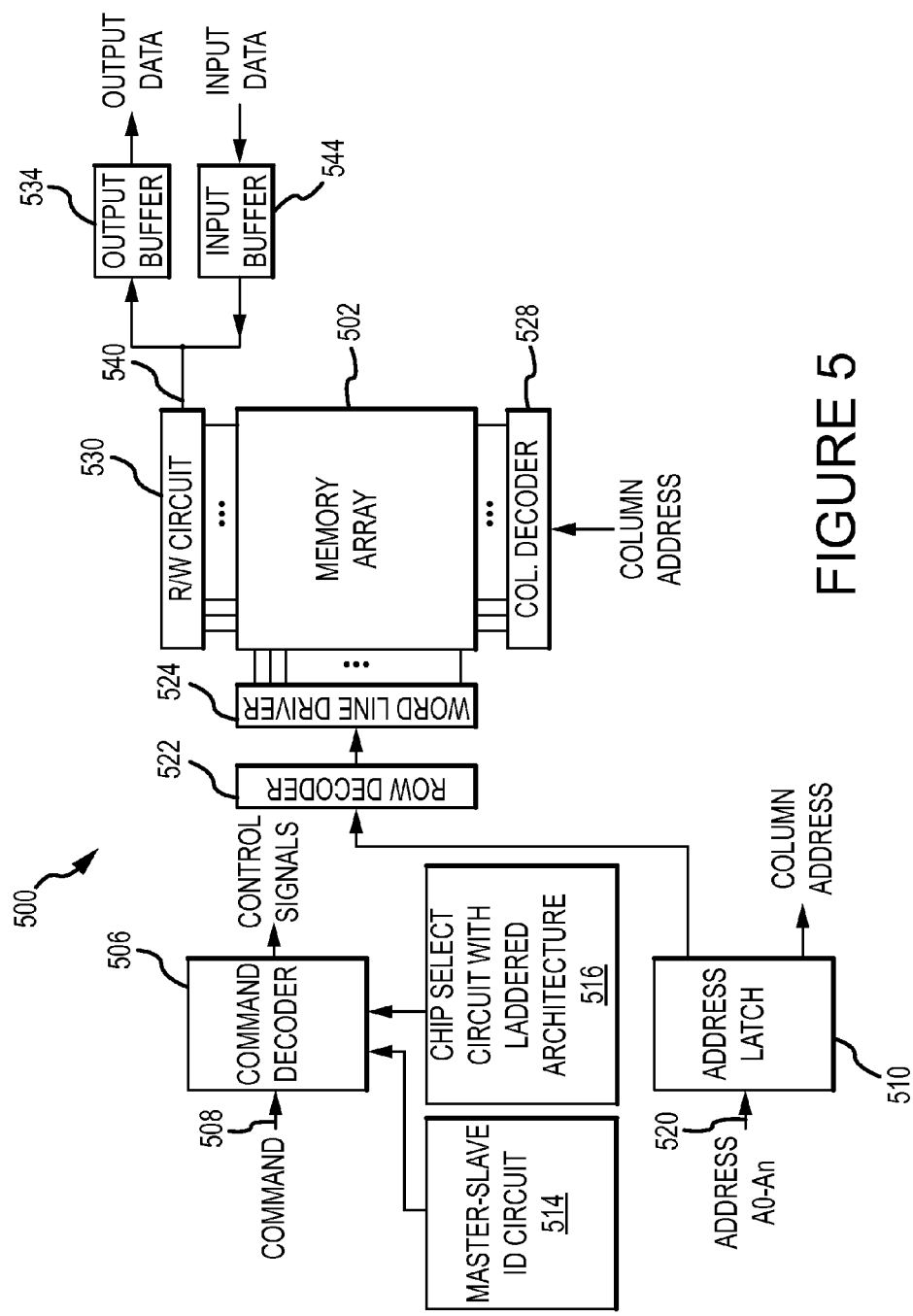
FIG. 5 is a block diagram of a particular illustrative embodiment of a memory including a master/slave identification circuit and a chip select detection circuit.

Referring to FIG. 5, block diagram of a memory 500 including master/slave identification circuit and a chip select detection circuit according to an embodiment of the invention. The memory 500 may include an array 502 of memory cells, which may be, for example, DRAM memory cells, SRAM memory cells, flash memory cells, or some other types of memory cells. The memory 500 includes a command decoder 506 that may receive memory commands through a command bus 508 and generate corresponding control signals within the memory 500 to carry out various memory operations. Row and column address signals may be applied to an address latch 510 in the memory 500 through an address bus 520. The address latch 510 may then output a separate column address and a separate row address.

The address latch 510 may provide row and column addresses to a row address decoder 522 and a column address decoder 528, respectively. The column address decoder 528 may select bit lines extending through the array 502 corresponding to respective column addresses. The row address decoder 522 may be connected to a word line driver 524 that activates respective rows of memory cells in the array 502 corresponding to received row addresses. The selected data line (e.g., a bit line or bit lines) corresponding to a received column address may be coupled to a read/write circuitry 530 to provide read data to a data output buffer 534 via an input-output data bus 540. Write data may be applied to the memory array 502 through a data input buffer 544 and the memory array read/write circuitry 530. The command decoder 506 may respond to memory commands applied to the command bus 508 to perform various operations on the memory array 502. In particular, the command decoder 506 may be used to generate internal control signals to read data from and write data to the memory array 502.

The memory 500 may further include a master/slave identification circuit 514 according to an embodiment of the invention. In some embodiments, the master/slave identification circuit 514 may include the apparatus 300 of FIG. 3 and/or the apparatus 400 of FIG. 4. For example, in a memory package, the master/slave identification circuit 514 may be configured to identify whether the memory 500 is a master memory unit or a slave memory unit by detecting a voltage level at a master/slave identification node. The master/slave identification circuit 514 may provide detection signals to the command decoder to provide control signals for a master memory unit or a slave memory unit based on the detection.

The memory 500 may further include a chip select detection circuit 516 according to an embodiment of the invention. In some embodiments, the chip select detection circuit 516 may include the apparatus 100 of FIG. 1 and/or the apparatus 200 of FIG. 2. For example, in a memory package, the chip select detection circuit 516 may be configured to identify whether memory commands, addresses, and data received from a memory controller (not shown) are intended for the memory 500 based on a corresponding chip select signal received from the memory controller. The chip select detection circuit 516 may provide detection signals to the command decoder to provide control signals for a master memory unit or a slave memory unit based on the detection.

Figure 6:
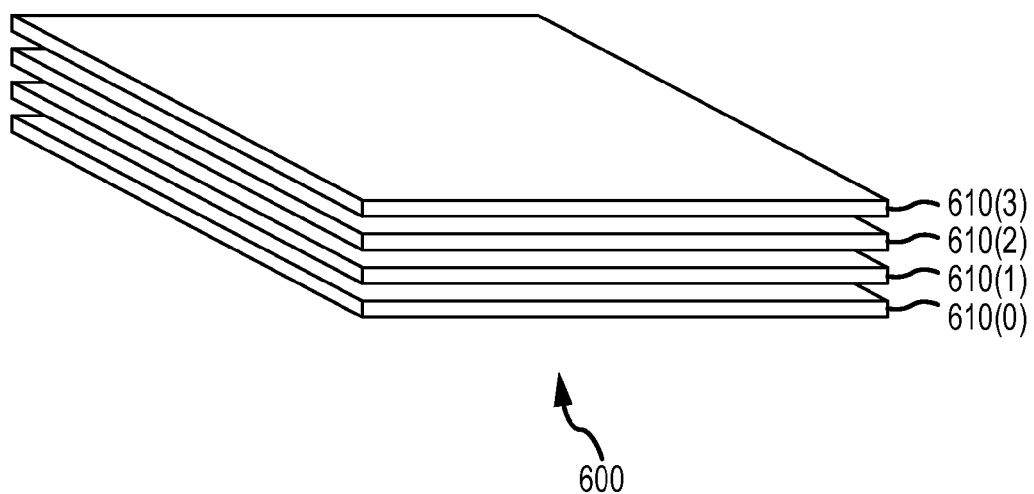
FIG. 6 is an illustration of a memory package according to one embodiment of the invention.

FIG. 6 illustrates a memory group 600 according to an embodiment of the invention. In the embodiment shown, a 4-high memory unit stack is illustrated, each memory unit having the master-slave identification circuit and/or the chip select detection circuit according to an embodiment of the present invention. In the embodiment shown, the bottom memory unit may be designated as the master memory unit 610(0), with a first slave memory unit 610(1), second slave memory unit 610(2), and third slave memory unit 610(3) stacked on top of it. As discussed above, memory groups according to embodiments of the present invention may be stacked in configurations 8-high, 16-high, 32-high, and so on. In some configurations the memory units may be stacked directly on top of one another, while in others, they may be offset.

Those of ordinary skill would further appreciate that the various illustrative logical blocks, configurations, circuits, and algorithm steps described in connection with the embodiments disclosed herein may be implemented as electronic hardware, computer software executed by a processor, or combinations of both. Various illustrative components, blocks, configurations, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those having ordinary skill in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a plurality of memory units, wherein each of the plurality of memory units comprises a chip select node located in a same relative position as chip select nodes of other memory units of the plurality of memory units, the plurality of memory units configured to receive a plurality of chip select signals, wherein each of the plurality of memory units is configured to receive a respective one of the plurality of chip select signals at the respective chip select node, wherein the plurality of memory units are configured to provide each of the plurality of chip select signals along a corresponding laddered path to the chip select node of the corresponding memory unit of the plurality of memory units.

2. The apparatus of claim 1, wherein the chip select node of each of the plurality of memory units is a first chip select node, wherein each of the plurality of memory units comprises a respective plurality of chip select nodes, including the first chip select node.

3. The apparatus of claim 2, wherein each of the plurality of memory units comprises a respective chip select detect circuit coupled to the respective first chip select node.

4. The apparatus of claim 2, wherein the respective first chip select node of a memory unit of the plurality of memory units is coupled to a chip select node of the plurality of chip select nodes other than the respective first chip select node of an adjacent memory unit of the plurality of memory units.

5. The apparatus of claim 2, wherein a memory unit of the plurality of memory units comprises a plurality of through-silicon vias, wherein a through-silicon via of the plurality of through-silicon vias is laterally offset from a chip select node of the plurality of chip select nodes to which the through-silicon via is coupled.

6. The apparatus of claim 2, further comprising an interconnect configured to couple a through-silicon via of the plurality of through-silicon vias of a memory unit of the plurality of memory units to a chip select node of the plurality of chip select nodes of an adjacent memory unit of the plurality of memory units.

7. The apparatus of claim 1, wherein a first memory unit of the plurality of memory units comprises a plurality of chip select input nodes.

8. The apparatus of claim 1, wherein each of the plurality of memory units comprises a master/slave detection circuit.

9. An apparatus comprising:
a first memory unit comprising a first chip select node and a second chip select node, wherein the first memory unit comprising a chip select detection circuit coupled to the first chip select node; and
a second memory unit coupled to the first memory unit, the second memory unit comprising a first chip select node coupled to the second chip select node of the first memory unit, the second memory unit further comprising a chip select detection circuit coupled to the first chip select node of the second memory unit, wherein the first chip select node of the second memory unit is aligned with the first chip select node of the first memory unit in a lateral direction and is offset from the second chip select node of the first memory unit in the lateral direction.

10. The apparatus of claim 9, wherein the first memory unit is configured to receive a first chip select signal at the first chip select node of the first memory unit.

11. The apparatus of claim 10, wherein the first memory unit is configured to receive a second chip select signal at the second chip select node of the first memory unit.

12. The apparatus of claim 9, wherein the first memory unit comprises a through-silicon via that is coupled to the second chip select node of the first memory unit and is aligned with the first chip select node of the second memory unit.

13. The apparatus of claim 9, further comprising an interconnect configured to couple the through-silicon via of the first memory unit to the first chip select node of the second memory unit.

14. The apparatus of claim 9, wherein the first memory unit further comprises a first plurality of additional chip select nodes, wherein each of the first plurality of additional chip select nodes is configured to receive a respective chip select signal of a plurality of additional chip select signals, and wherein the second memory unit further comprises a second plurality of additional chip select nodes, wherein an additional chip select node of the second plurality of additional chip select nodes is configured to receive a respective chip select signal of the plurality of additional chip select signals via a respective chip select node of the first plurality of additional chip select nodes of the first memory unit that is offset from the additional chip select node in the lateral direction.

15. The apparatus of claim 9, wherein the first memory unit comprises a first memory/slave detection circuit configured to detect whether the first memory unit is a master or a slave memory unit, and wherein the second memory unit comprises a second memory/slave detection circuit configured to detect whether the second memory unit is a master or a slave memory unit.

16. The apparatus of claim 9, wherein a circuitry layout of the first memory unit is interchangeable with the second memory unit.

17. An method comprising:
receiving a first chip select signal at a first node of a first memory unit;
receiving a second chip select signal at a second node of the first memory unit;
providing the first chip select signal to a chip select detect circuit of the first memory unit; and
providing the second chip select signal to a first chip select node of a second memory unit, wherein the first chip select node of the second memory unit is aligned with the first chip select node of the first memory unit in a direction and is offset from the second chip select node of the first memory unit in the direction.

18. The method of claim 17, further comprising:
detecting the first chip select signal at the first memory unit; and
performing a memory access operation at the first memory unit responsive to detecting the first chip select signal.

19. The method of claim 17, further comprising:
detecting the second chip select signal at the second memory unit; and
performing a memory access operation at the first memory unit responsive to detecting the first chip select signal.

20. The method of claim 17, further comprising detecting, based on a voltage received at a master/slave detection node of the first memory unit, whether the first memory unit is a master memory unit or a slave memory unit.

* * * * *